United States Patent
Nishino et al.

(10) Patent No.: US 9,954,013 B2
(45) Date of Patent: Apr. 24, 2018

(54) DISPLAY DEVICE AND METHOD OF MANUFACTURING THE SAME

(71) Applicant: Japan Display Inc., Tokyo (JP)

(72) Inventors: Tomonori Nishino, Tokyo (JP); Syou Yanagisawa, Tokyo (JP); Kentaro Agata, Tokyo (JP); Nobuyuki Ishige, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/089,160

(22) Filed: Apr. 1, 2016

(65) Prior Publication Data
US 2016/0218122 A1 Jul. 28, 2016

Related U.S. Application Data

(63) Continuation of application No. 14/071,886, filed on Nov. 5, 2013, now Pat. No. 9,335,595.

(30) Foreign Application Priority Data

Nov. 9, 2012 (JP) .................. 2012-247016

(51) Int. Cl.
*G02F 1/1345* (2006.01)
*G02F 1/1362* (2006.01)
*H01L 27/12* (2006.01)

(52) U.S. Cl.
CPC ...... *H01L 27/1244* (2013.01); *G02F 1/13452* (2013.01); *G02F 1/13458* (2013.01); *G02F 1/136204* (2013.01); *G02F 1/136227* (2013.01)

(58) Field of Classification Search
CPC ............... G02F 1/1362; G02F 1/13452; G02F 1/136227; G02F 1/136204; G02F 1/13458; H01L 27/3248; H01L 27/1244
(Continued)

(56) References Cited

U.S. PATENT DOCUMENTS 3,416,043 A * 12/1968 Jorgensen ........... H01L 27/0826
257/563
6,320,630 B1 * 11/2001 Yamashita ........... G09G 3/3611
349/42
(Continued)

FOREIGN PATENT DOCUMENTS

JP 2004-192015 A 7/2004
JP 2005-259371 A 9/2005
(Continued)

OTHER PUBLICATIONS

Japanese Office Action dated Mar. 29, 2016 regarding Japanese corresponding Patent Application No. 2012-247016.

*Primary Examiner* — Johannes P Mondt
(74) *Attorney, Agent, or Firm* — Typha IP LLC (57) ABSTRACT

This invention aims at reducing the probability of short-circuiting between terminals in a display device in which an IC driver is connected by COG. Terminals for connection with the IC driver are formed in a terminal region of a TFT substrate (100). The terminals are each comprised of a terminal metal (60), a first through-bole formed in a first insulation film (107), a second through-hole formed in a second insulation film (109), a first ITO (20) formed in the first through-hole and being in contact with the terminal metal (60), and a second ITO (30) formed over the first ITO (20). The second ITO (30) is formed within an area where the second ITO is in contact with the first ITO but is not formed outside the second through-hole. This ensures that the distance between the ITOs of the adjacent terminals can be enlarged, whereby the probability of short-circuiting between the terminals can be lowered.

11 Claims, 13 Drawing Sheets

(58) Field of Classification Search
USPC .................. 257/72, 59; 349/139, 152, 151
See application file for complete search history.

(56) References Cited

U.S. PATENT DOCUMENTS

| | | | |
|---|---|---|---|
| 2001/0020988 A1* | 9/2001 | Ohgiichi | G02F 1/1345 349/54 |
| 2001/0020994 A1* | 9/2001 | Kaneko | G02F 1/136286 349/147 |
| 2007/0085962 A1 | 4/2007 | Yoshioka | |
| 2008/0012016 A1* | 1/2008 | Inoue | G02F 1/13439 257/59 |
| 2008/0180627 A1 | 7/2008 | Yasuda et al. | |
| 2009/0115950 A1* | 5/2009 | Toyota | G02F 1/136213 349/114 |
| 2009/0134407 A1* | 5/2009 | Inoue | H01L 23/53219 257/88 |
| 2012/0068944 A1* | 3/2012 | Oh | G02F 1/13338 345/173 |
| 2012/0069259 A1 | 3/2012 | Oh et al. | |
| 2012/0138933 A1* | 6/2012 | Kwon | H01L 27/1225 257/59 |
| 2013/0010246 A1* | 1/2013 | Miwa | G02F 1/136227 349/138 |

FOREIGN PATENT DOCUMENTS

| | | | | |
|---|---|---|---|---|
| JP | 2008-0028145 A | 2/2008 | | |
| WO | 2011129128 A1 | 10/2011 | | |
| WO | WO-2011129128 A1 * | 10/2011 | | G02F 1/1343 |

\* cited by examiner

DISPLAY DEVICE AND METHOD OF MANUFACTURING THE SAME

CROSS-REFERENCE TO RELATED APPLICATION

This application is a continuation of U.S. application Ser. No. 14/071,886, filed on Nov. 5, 2013. Further, this application claims priority from Japanese Patent Application JP 2012-247016 filed on Nov. 9, 2012, the content of which is hereby incorporated by reference into this application.

BACKGROUND OF THE INVENTION

1. Field of the Invention

The present invention relates to a liquid crystal display device. The invention particularly relates to a liquid crystal display device configured to prevent from generation of short-circuiting between terminals or between bumps when the bump pitch in an IC driver is reduced in COG (Chip On Glass) connection.

2. Description of the Related Art

A conventional liquid crystal display device includes a TFT substrate having a pixel electrode, thin film transistors (TFT), etc. formed in a matrix; a counter substrate disposed in facing relation to the TFT substrate and having a black matrix, a overcoat layer, etc. formed at portions corresponding to the pixel electrodes of the TFT substrate; and liquid crystals put between the TFT substrate and the counter substrate. Images are formed by controlling the transmittance of light for every pixel by liquid crystal molecules.

Especially in medium- or small-sized liquid crystal display devices, there has been a tendency toward an increasingly finer structure, and the number of terminals has been increasing accordingly. On the other hand, in the IC driver for driving the liquid crystal display device, a shortening of the pitch between terminals (between bumps) permits the chip size to be reduced and promises a reduction in the cost of the IC driver. Thus, the terminal pitch has been reduced more and more in order to meet the demand from both the liquid crystal panel and the IC driver. When the terminal pitch becomes smaller, however, insulation between the terminals would become a problem.

JP-A-2008-28145 describes an approach for solving the problem that as the terminal pitch becomes smaller, the bumps of an IC driver may come to fail to enter (drop) into recesses of terminals. In the approach described in JP-A-2008-28145, the opening of the recess of each terminal is enlarged, and a lower-layer conductive film and an upper-layer conductive film are formed inside the enlarged opening so that the lower-layer conductive film is covered with the upper-layer conductive film. The configuration proposed in JP-A-2008-28145 makes it easy for the bumps of the IC driver to enter into the recesses of the terminals. In the recess, however, the width of the upper-layer conductive film would be enlarged, and the spacing between the terminals would be narrowed. Consequently, the problem of short-circuiting between the terminals still remains unsolved.

SUMMARY OF THE INVENTION

Figure 18:
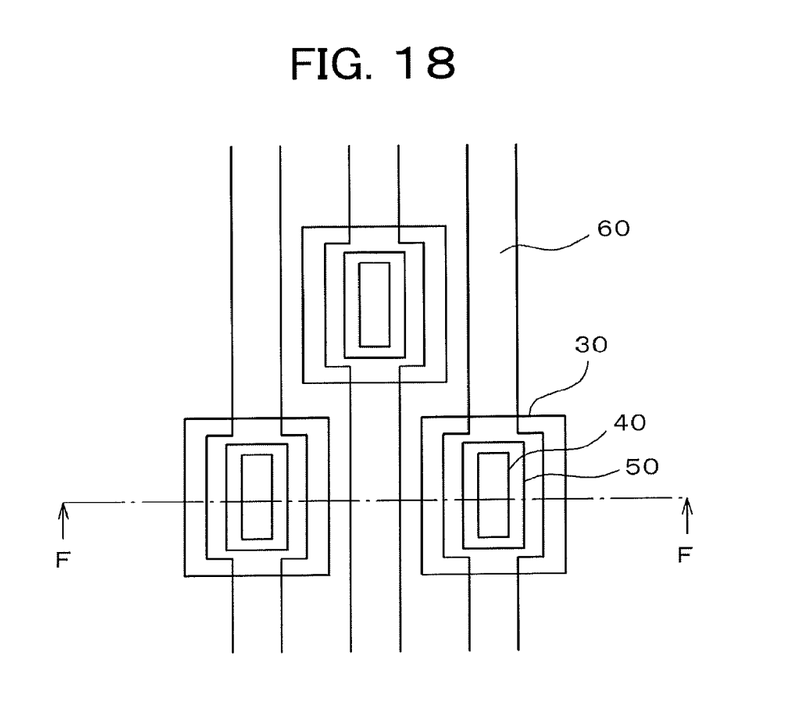
FIG. 18 is a plan view of terminals according to a related art.
Figure 19:
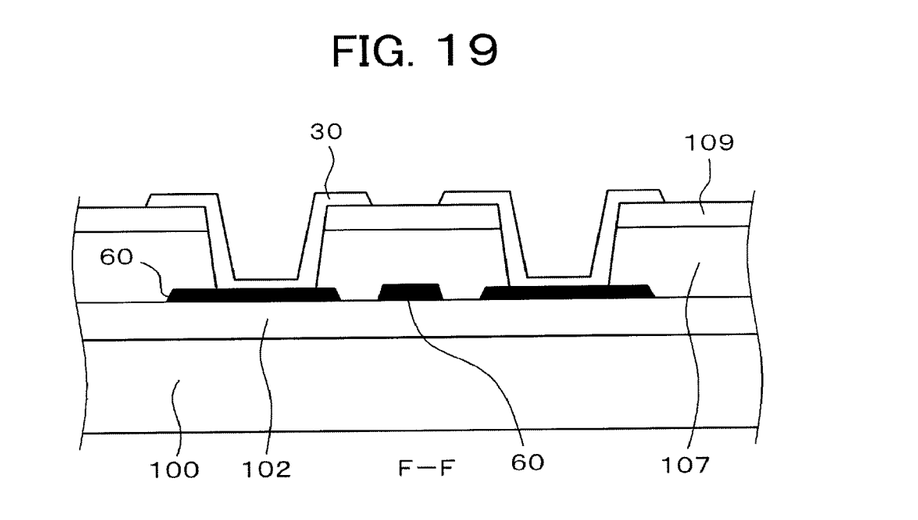
FIG. 19 is a sectional view taken along line F-F of FIG. 18.

FIG. 18 is a plan view showing the structure of terminal parts according to the related art, and FIG. 19 is a sectional view taken along line F-F of FIG. 18. To make the distance between terminals as large as possible, the terminals are arranged in a so-called zigzag (or staggered} pattern as shown in FIG. 18. In FIG. 18, a terminal metal is formed of a drain terminal metal 60 formed simultaneously with a drain layer, and the width of the drain terminal metal 60 is enlarged in the terminal area.

As shown in FIG. 18, the terminal, on a plan-view basis, is comprised of the terminal metal 60, an organic passivation film through-hole 40, an inter-layer dielectric through-hole 50, and a pixel ITO 30. While the terminal metal 60 in FIG. 18 is formed of the drain layer terminal metal 60 formed simultaneously with a drain wiring, the terminal metal may in some cases be formed of a gate layer terminal metal formed simultaneously with a gate electrode layer.

FIG. 19 is a sectional view showing the structure of the terminal. In FIG. 19, a gate insulation film 102 is formed on a TFT substrate 100 formed of a glass, and the drain layer terminal metal 60 is formed thereon. An organic passivation film 107 is formed so as to cover the terminal metal 60, and an inter-layer dielectric 109 composed of SiN or the like is formed thereon. A through-hole is formed to penetrate the inter-layer dielectric 109 and the organic passivation film 107, and pixel ITO 30 formed simultaneously with pixel electrodes in a display region is patterned inside each through-hole part. The pixel ITO 30 plays the role of protecting the drain layer terminal metal 60.

As shown in FIG. 18 or 19, the problem involved in the related art is that the spacing between the adjacent pixel ITOs 30 is reduced as the terminal pitch becomes smaller. When the spacing between the adjacent pixel ITOs 30 is reduced, the probability of short-circuiting between terminals after connection of the IC driver is enhanced.

Figure 20:
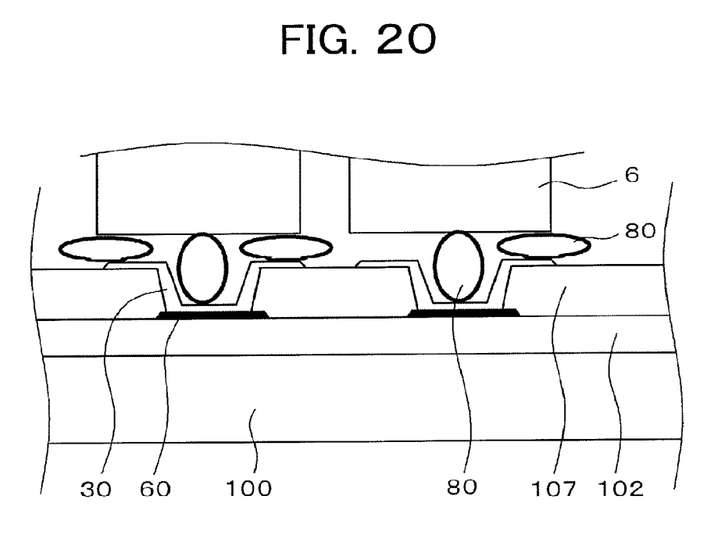
FIG. 20 is a sectional view showing a problem in the related art.

FIG. 20 is a sectional view illustrating the manner in which the short-circuiting occurs. The bump 6 of the IC driver is connected to the terminal of the liquid crystal display panel by an anisotropic conductive film having conductive particles 80. The conductive particles 80 are deformed as shown in FIG. 20 when press bonded by the bump 6 or the like. Then, short-circuiting between the terminals or between the bumps is liable to be caused by the conductive particles 80, as shown in FIG. 20.

Meanwhile, a problem with liquid crystal display devices lies in the small view angle. A liquid crystal display device of the IPS (In-Plane Switching) system is advantageous in that the view angle can be broadened. In the case of IPS, both the pixel electrode and the common electrode are present on the TFT substrate side, with an insulation layer interposed therebetween. Therefore, in the case of IPS, both the pixel ITO formed simultaneously with the pixel electrodes and the common ITO formed simultaneously with the common electrode can be used for the terminal.

Figure 21:
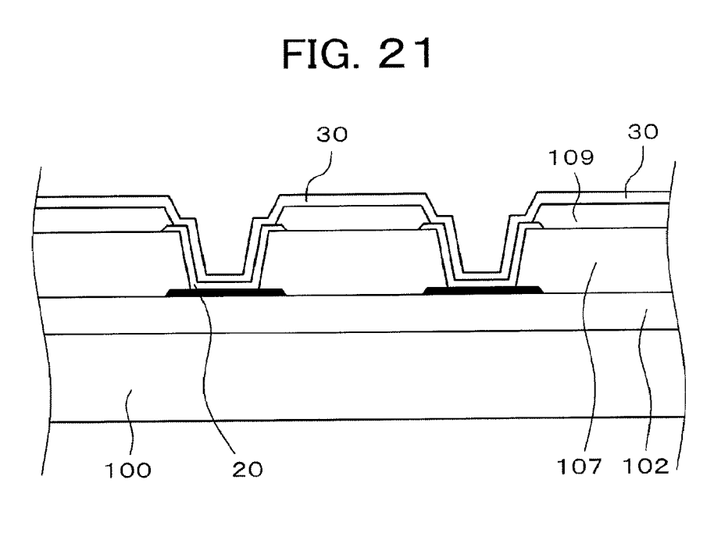
FIG. 21 is part of a manufacturing process for the terminals according to another related art.
Figure 22:
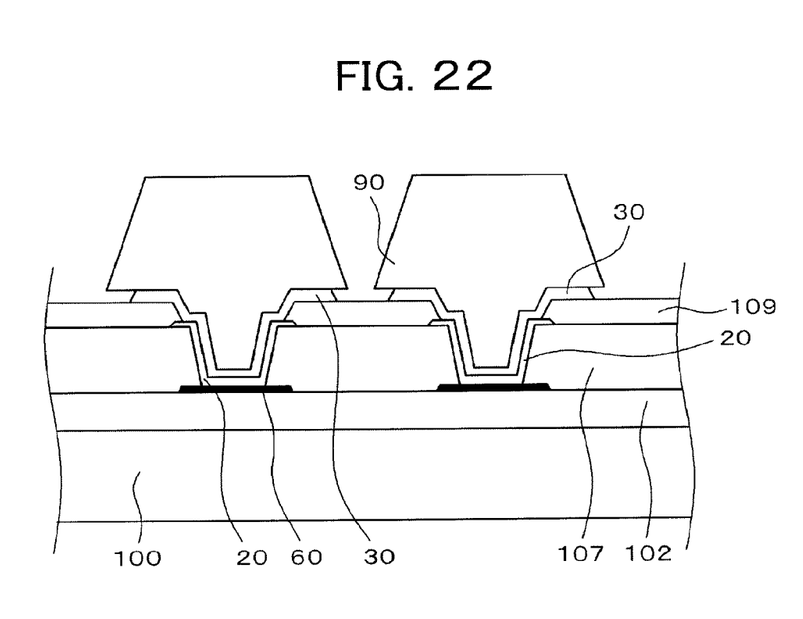
FIG. 22 is part of the manufacturing process for the terminals, subsequent to the part of the manufacturing process shown in FIG. 21.
Figure 23:
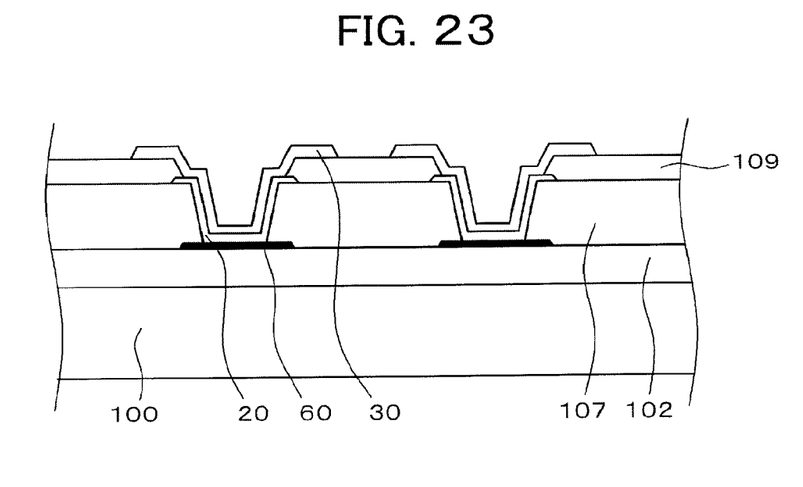
FIG. 23 is a sectional view of terminals according to a further related art.

FIGS. 21 to 23 are sectional views for illustrating a process of forming a terminal for which both the pixel ITO 30 and the common ITO 20 are used. In FIG. 21, a gate insulation film 102, a drain layer terminal metal 60 and an organic passivation film 107 are sequentially formed over a TFT substrate 100, and a through-hole 40 is formed in the organic passivation film 107, in the same manner as in FIGS. 18 and 19.

In FIG. 21, the common ITO 20 is formed inside the through-hole 40 formed in the organic passivation film 107. After the common ITO 20 is patterned, the inter-layer dielectric 109 is formed, then a through-hole 50 is formed in the inter-layer dielectric 109, and thereafter the pixel ITO 30 is formed.

FIG. 22 is a sectional view showing the state in which the pixel ITO 30 is being patterned by use of a resist 90. Thereafter, the resist 90 in FIG. 22 is stripped, whereon a terminal comprised of the pixel ITO 30 is formed as shown in FIG. 23. In FIG. 23, the ITO for protecting the terminal metal 60 is formed to have a two-layer structure, so that reliability of the terminal metal 60 against corrosion is enhanced.

The terminal structure shown in FIG. 23, however, also has the problem that a reduction in terminal pitch leads to a reduction in the spacing between the pixel ITOs 30 and possibly to failure of insulation between the terminals, like in the terminal structure shown in FIG. 19. Thus, the problem illustrated in FIG. 20 may be generated also in the structure of FIG. 23.

Thus, there is a need to prevent the upper-layer ITO interval from being reduced and thereby prevent short-circuiting from occurring between terminals, even in the case where terminal pitch is decreased.

According to embodiments of the present invention, there are provided technical solutions to the above-mentioned technical problem, as follows.

(1) A display device comprises: a TFT substrate having a terminal region and a display region in which pixels each having a TFT are formed in a matrix pattern; and an IC driver connected to the terminal region of the TFT substrate; wherein: the terminal region has terminals for connection with the IC driver formed therein;

the terminals each include
a terminal metal,
a first through-hole formed in a first insulation film,
a second through-hole formed in a second insulation film,
a first ITO formed in the first through-hole and being in contact with the terminal metal, and
a second ITO formed over the first ITO; and the second ITO is formed within an area where the second ITO is in contact with the first ITO but is not formed outside the second through-hole.

(2) A display device comprises: a TFT substrate having a terminal region and a display region in which pixels each having a TFT are formed in a matrix pattern; and an IC driver connected to the terminal region of the TFT substrate; wherein: the terminal region has terminals for connection with the IC driver formed therein;

the terminals each include
a first ITO,
a through-hole formed in an insulation film, and
a second ITO formed over the first ITO; and the second ITO is formed within an area where the second ITO is in contact with the first ITO but is not formed outside the through-hole.

(3) A method of manufacturing a display device, the display device comprising a TFT substrate having a terminal region and a display region in which pixels each having a TFT are formed in a matrix pattern, and an IC driver connected to the terminal region of the TFT substrate, the terminal region having terminals for connection with the IC driver, the method comprising the steps of:

forming a terminal metal over the TFT substrate;
forming an insulation film so as to cover the terminal metal;
forming a through-hole in the insulation film, the insulation film being associated with part of the terminal metal;
forming a first ITO in the through-hole;
making the first ITO polycrystalline;
forming a second ITO so as to cover the first ITO and the insulation film; and
removing part of the second ITO exclusive of that portion where the second ITO is in contact with the first ITO by etching the second ITO without using any resist.

According to the present invention, the width of the uppermost-layer ITO in the terminal area can be reduced, as compared with that in the related art. Therefore, it is possible to prevent short-circuit from occurring between terminals or between IC driver bumps even in the case where the terminal pitch is reduced.

DESCRIPTION OF THE PREFERRED EMBODIMENTS

Now, the present invention will be described in detail below, based on embodiments thereof.

First Embodiment

Figure 1:
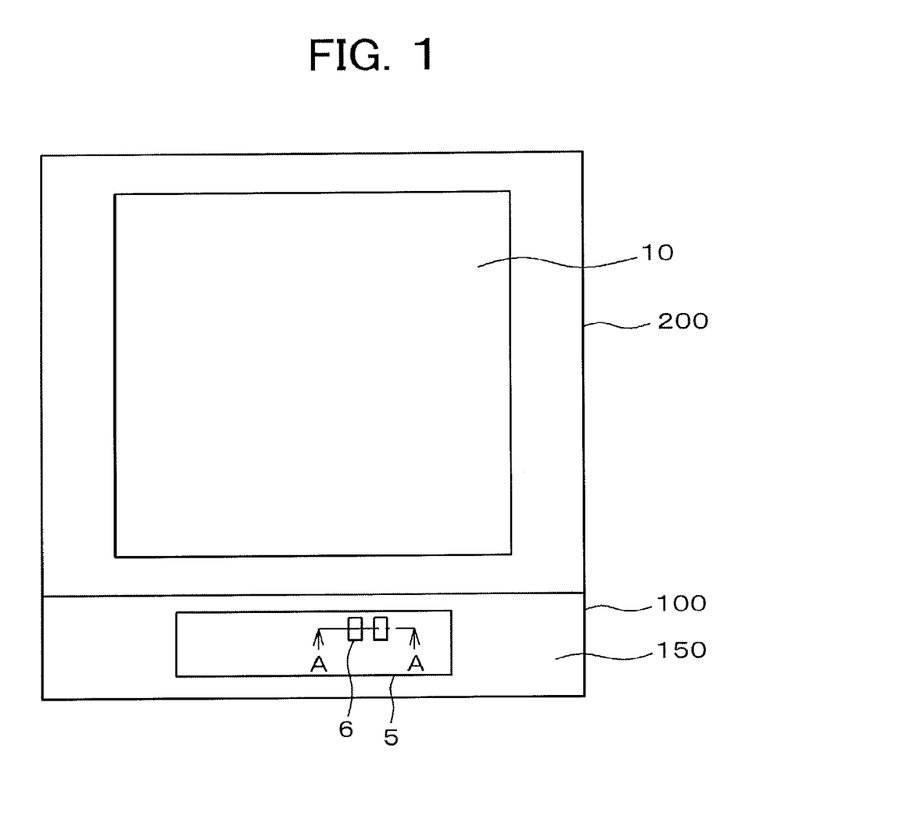
FIG. 1 is a plan view of a liquid crystal display device to which the present invention is applied.

FIG. 1 is a plan view showing an example of a liquid crystal display device to which the present invention is applied. FIG. 1 shows a liquid crystal display device to be used in a cellphone or the like. In FIG. 1, a counter substrate 200 is disposed over a TFT substrate 100, with a liquid crystal layer (not shown) sandwiched between the TFT substrate 100 and the counter substrate 200. The TFT substrate 100 and the counter substrate 200 are formed with a display region 10. The TFT substrate 100 is formed to be larger than the counter substrate 200, and the area where the TFT substrate 100 is present singly (or alone, without being accompanied by the counter substrate 200) constitutes a terminal region. In the terminal region, an IC driver 5 is mounted on the TFT substrate 100. The IC driver 5 has bumps 6, and terminals are formed in the terminal region of the TFT substrate 100 correspondingly to the bumps 6 of the IC driver 5.

Figure 2:
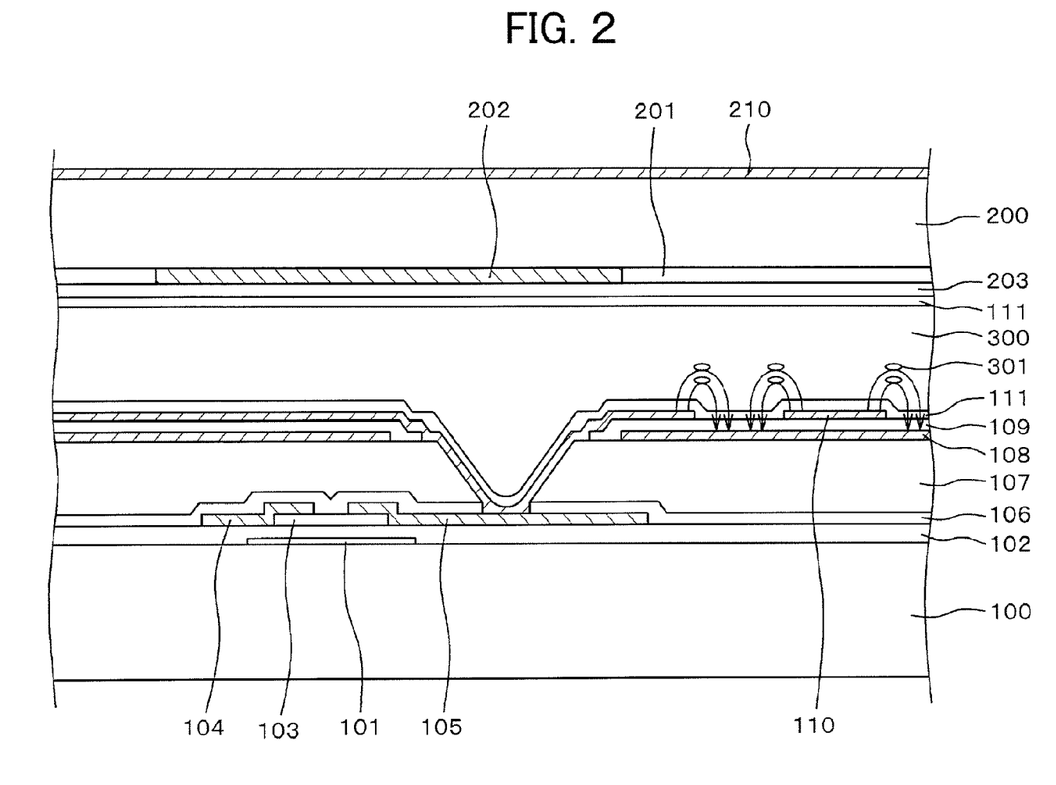
FIG. 2 is a sectional view of a pixel region of an IPS liquid crystal display device.

FIG. 2 is a sectional view showing the structure of a pixel part in the display region 10. Specifically, FIG. 2 is a sectional view showing an IPS structure. In FIG. 2, a gate electrode 101 is formed on the TFT substrate 100, and a gate insulation film 102 is formed so as to cover the gate electrode 101. On the gate insulation film 102, a semiconductor layer 103 is formed in an area corresponding to the gate electrode 101. On the semiconductor layer 103, a drain electrode 104 and a source electrode 105 are disposed opposite to each other. The drain electrode 104 is in connection with an image signal line at a portion which is not shown.

An inorganic passivation film 106 is formed to cover the drain electrode 104 and the source electrode 105, and an organic passivation film 107 is formed thereon. A common electrode 108 is formed on the organic passivation film 107, an inter-layer dielectric 109 is formed on the common electrode 108, and a pixel electrode 110 having slits is formed on the inter-layer dielectric 109. The common electrode 108 and the pixel electrode 110 are each formed of ITO, which is a transparent conductive film, and these ITO films are used as protective conductive films at the terminal.

The inter-layer dielectric 109, the organic passivation film 107 and the inorganic passivation film 106 are formed with a through-hole, through which the source electrode 105 and the pixel electrode 110 are connected to each other. An alignment film 111 for aligning liquid crystals is formed so as to cover the pixel electrode 110 and the inter-layer dielectric 109.

In FIG. 2, the counter substrate 200 is disposed facing the TFT substrate 100, with the liquid crystal layer 300 sandwiched therebetween. The counter substrate 20 is formed on its inner side with a color filter 201 and a black matrix 202, which are covered by an overcoat layer 203 formed thereon. An alignment film 111 for aligning liquid crystal molecules 301 is formed on the overcoat layer 203. The counter substrate 200 is formed on its outer side with an external conductive film 210 for protecting the inside of the liquid crystal display panel from external noises.

In FIG. 2, when an image signal is supplied through the TFTs to the pixel electrodes 110, electric lines of force as shown in the figure are generated, whereby the liquid crystal molecules 301 are rotated accordingly. As a result, the transmittance of the liquid crystal layer 300 is varied on a pixel basis, whereby an image is formed. The layer structure in each terminal is formed simultaneously with the production of the pixel structure in the display region 10 as described above. In addition, while a configuration in which the inorganic passivation film 106 is omitted is shown in the sections showing the terminal structure below, it is natural that the inorganic passivation film 106 may be present in some cases.

Figure 3:
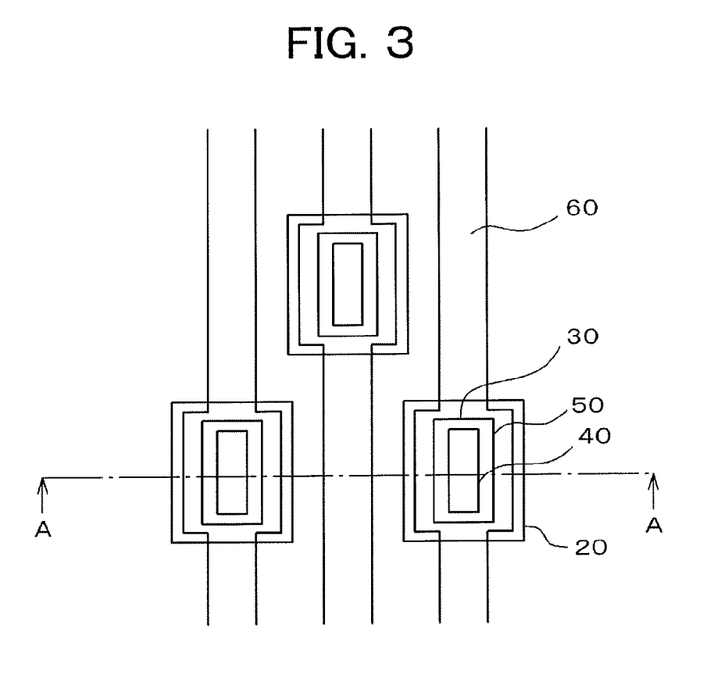
FIG. 3 is a plan view of terminals in a first embodiment.

FIG. 3 is a plan view showing the configuration of terminals in the first embodiment of the present invention, in a part where the IC driver 5 is mounted. FIG. 3 showing the present invention differs largely from FIG. 18 showing the related art in that the width of the pixel ITO 30 in the uppermost layer is smaller than that in the related art. For instance, in the terminals according to the related art, the width of the pixel ITO 30 in the uppermost layer is the greatest. In the terminals according to the present invention, on the other hand, the width of the pixel ITO 30 in the uppermost layer is equal to the width of the inter-layer dielectric through-hole 50. In FIG. 3, the width of the uppermost-layer pixel ITO 30 is smaller than the width of the common ITO 20, which is the lower-layer ITO, or the width of the terminal metal 60 in the terminal. The fact that the width of the uppermost-layer ITO 30 is small means that it is possible, after connection of the IC driver 5, to reduce the probability of short-circuiting between the terminals.

Figure 4:
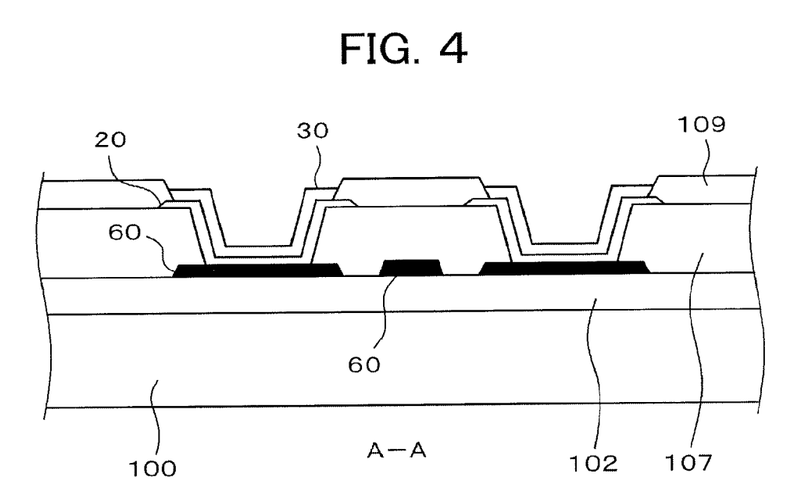
FIG. 4 is a sectional view taken along line A-A of FIG. 3.

FIG. 4 is a sectional view taken along line A-A of FIG. 3. FIG. 4 showing the sectional view in the present invention differs greatly from FIG. 23 showing the sectional view in the related art in that the width of the pixel ITO 30, which is the uppermost-layer ITO, in FIG. 4 is smaller than that in FIG. 23. In FIG. 4, the pixel ITO 30 is well contained in the through-hole 50 in the inter-layer dielectric 109. On the other hand, in FIG. 23 showing the related art, the pixel ITO 30 is getting onto the inter-layer dielectric 109 by a predetermined width. In FIG. 4, therefore, the probability of short-circuiting between the pixel ITOs 30 can be much lowered, as compared with the case of FIG. 23. In other points, FIG. 4 is the same as FIG. 23.

Figure 5:
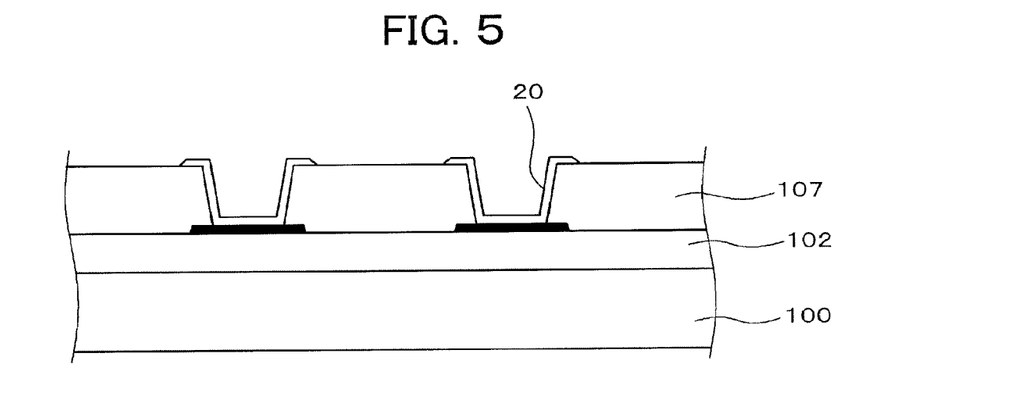
FIG. 5 shows a manufacturing step for the terminals in the first embodiment.

FIGS. 5 to 8 are sectional views showing steps of a process for obtaining the terminal structure in the present invention shown in FIG. 4. In FIG. 5, a gate insulation film 102, a drain layer terminal metal 60 and an organic passivation film 107 are sequentially formed over a TFT substrate 100. A through-hole 40 is formed in the organic passivation film 107, and common ITO 20 is formed in a patterned state in the through-hole 40. The common ITO 20 in this instance is formed by sputtering, and is amorphous in the beginning.

Figure 6:
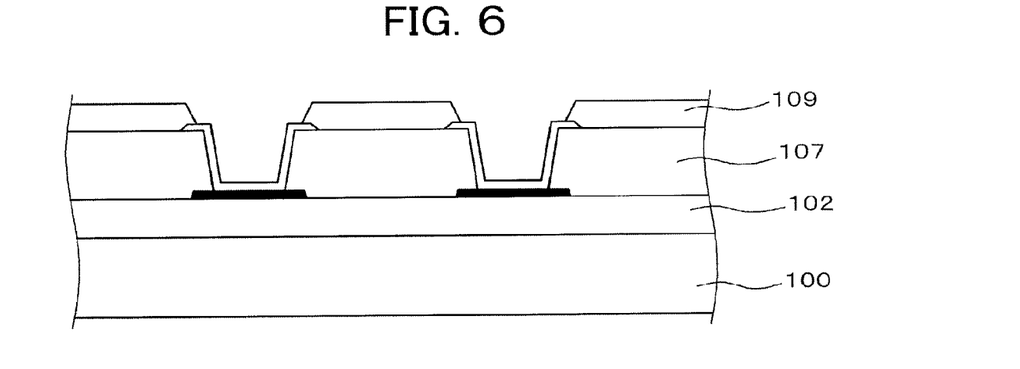
FIG. 6 shows a manufacturing step for the terminals in the first embodiment, subsequent to the step shown in FIG. 5.

FIG. 6 is a sectional view showing a state in which an inter-layer dielectric 109 has been formed on the common ITO 20 and the organic passivation film 107, and a through-hole 50 is formed at each terminal. In FIG. 6, those portions of the common ITO 20 which are getting onto the organic passivation film 107 are partly covered with the inter-layer dielectric 109. The inter-layer dielectric 109 in FIG. 6 is formed by CVD, and, in this instance, the substrate temperature reaches about 210° C. This results in that the common ITO 20 having been formed in the through-hole 40 and having been amorphous in the beginning is made to be polycrystalline.

Figure 7:
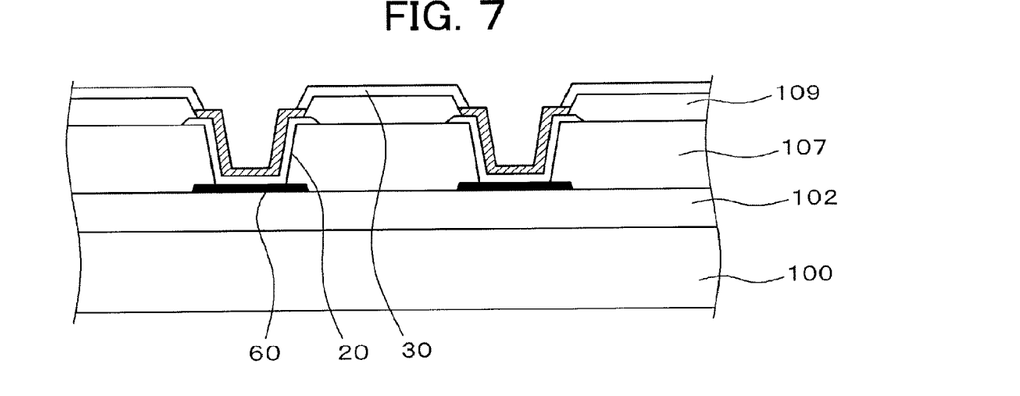
FIG. 7 shows a manufacturing step for the terminals in the first embodiment, subsequent to the step shown in FIG. 6.

FIG. 7 shows a state in which pixel ITO 30 has been formed on the common ITO 20 and the inter-layer dielectric 109. The pixel ITO 30 is also formed by sputtering; therefore, the pixel ITO 30 is also amorphous initially. The amorphous ITO, however, has such a property as to be made polycrystalline when formed on polycrystalline ITO. Specifically, at the time when the pixel ITO 30 is formed by sputtering and the assembly is taken out of the sputtering chamber, that portion of the pixel ITO 30 which is in contact with the common ITO 20 has been made polycrystalline.

Meanwhile, amorphous ITO and polycrystalline ITO are etched by use of different etchants. Specifically, the amorphous ITO is etched by use of oxalic acid, whereas the polycrystalline ITO is etched by use of hydrogen bromide (HBr). Besides, the polycrystalline ITO is not etched when etching is conducted using oxalic acid. Therefore, when the structure shown in FIG. 7 is etched using oxalic acid, that portion of the pixel ITO 30 which is in contact with the common ITO 20 and has been thereby made polycrystalline is left unetched, whereas the other portions of the pixel ITO 30 are etched away by oxalic acid.

Figure 8:
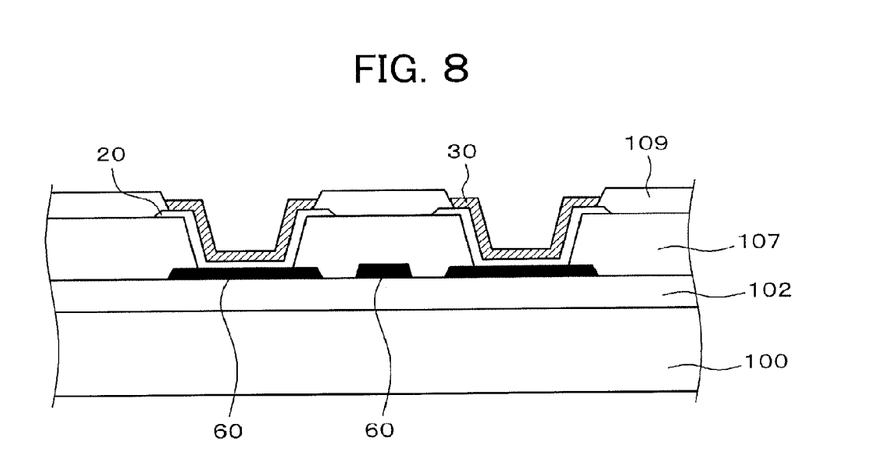
FIG. 8 is a sectional view of the completed terminals in the first embodiment.

In short, the pixel ITO 30 is patterned without use of any resist. A section of the structure in the first embodiment of the present invention formed as above-mentioned is shown in FIG. 8. Although FIG. 8 is essentially the same as FIG. 4, the pixel ITO 30 in FIG. 8 is hatched to emphasize that the pixel ITO 30 has been made polycrystalline.

A further important point in this process resides in that since the pixel ITO 30 is left only in such an area as to make contact with the common ITO 20, the area where the pixel ITO 30 is present is restricted to within the through-hole 50 in the inter-layer dielectric 109. Therefore, the distance between the pixel ITOs 30 in the uppermost layer can be enlarged, as compared with the related art. Accordingly, the probability of short-circuiting between the terminals can be reduced, as compared with the related art.

Second Embodiment

Figure 9:
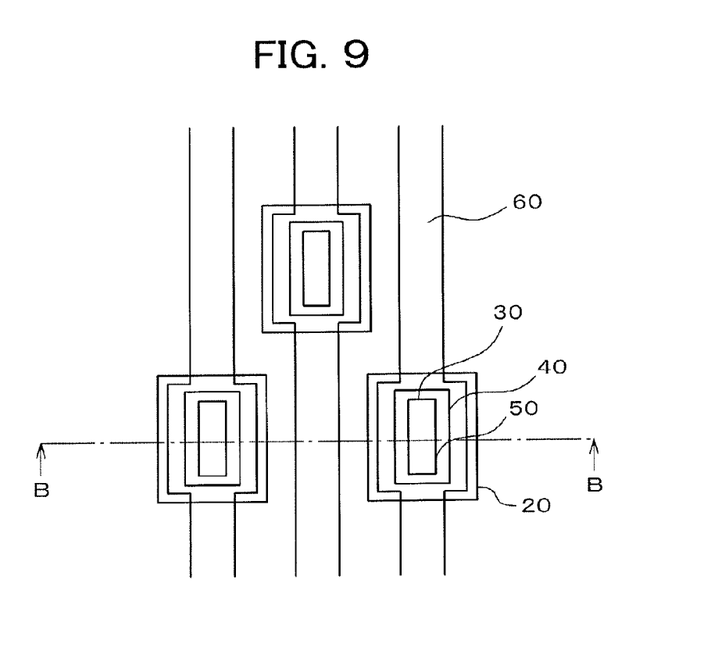
FIG. 9 is a plan view of terminals in a second embodiment.

FIG. 9 is a plan view showing a second embodiment of the present invention. The difference of this second embodiment shown in FIG. 9 from the first embodiment shown in FIG. 3 lies in that pixel ITO 30 as an uppermost layer is restricted to within a through-hole 50 in an inter-layer dielectric 109 formed inside a through-hole 40 in an organic passivation film 107. Therefore, the distance between the pixel ITOs 30 can be further shortened, as compared with the first embodiment; accordingly, the probability of short-circuiting between the terminals can be further lowered, as compared with the first embodiment.

Figure 10:
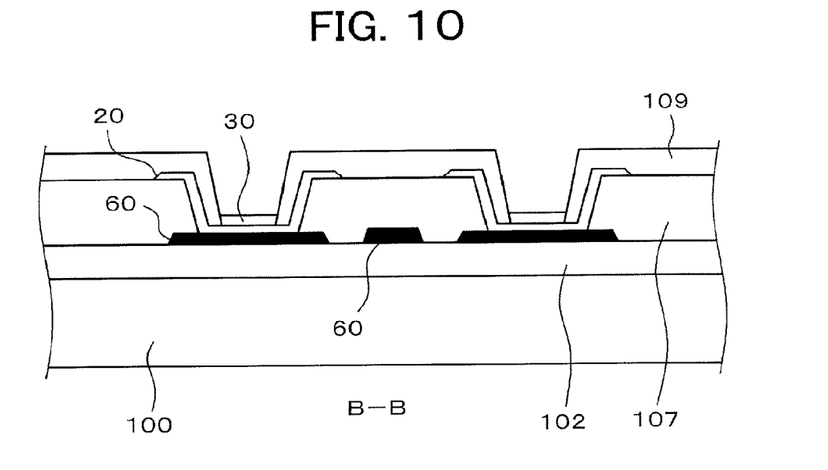
FIG. 10 is a sectional view taken along line B-B of FIG. 9.

FIG. 10 is a sectional view taken along line B-B of FIG. 9. In FIG. 10, a common ITO 20 is patterned, and thereafter the inter-layer dielectric 109 is formed by CVD. As shown in FIG. 10, the through-hole 50 in the inter-layer dielectric 109 is formed inside the through-hole 40 in the organic passivation film 107. Thereafter, the pixel ITO 30 is formed by sputtering. Inside the through-hole 50 in the inter-layer dielectric 109, the pixel ITO 30 is made polycrystalline by making contact with the common ITO 20 which has already been made polycrystalline. When the thus formed pixel ITO 30 is subjected to etching conducted using oxalic acid, only that portion of the pixel ITO 30 located inside the through-hole 50 in the inter-layer dielectric 109 is left unetched.

Consequently, the configuration in this second embodiment allows the probability of short-circuiting between terminals to be further lowered, as compared with the configuration in the above-described first embodiment.

Third Embodiment

Figure 11:
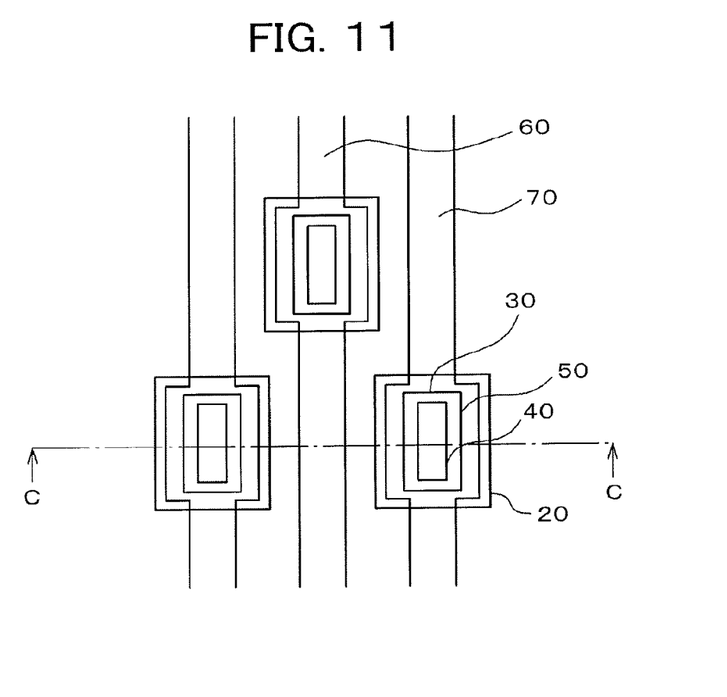
FIG. 11 is a plan view of terminals in a third embodiment.

FIG. 11 is a plan view showing a third embodiment of the present invention. This third embodiment shown in FIG. 11 differs from the first embodiment shown in FIG. 3 in that the metal used as the terminal metal is not a drain layer terminal metal formed simultaneously with a drain electrode but is a gate layer terminal metal 70 formed simultaneously with a gate electrode. Therefore, as the through-hole in a terminal part, a through-hole in a gate insulation film 102 is formed in addition to the through-hole 40 in the organic passivation film 107. In other points, the configuration shown in FIG. 11 of the third embodiment is the same as the configuration shown in FIG. 3 of the first embodiment.

Figure 12:
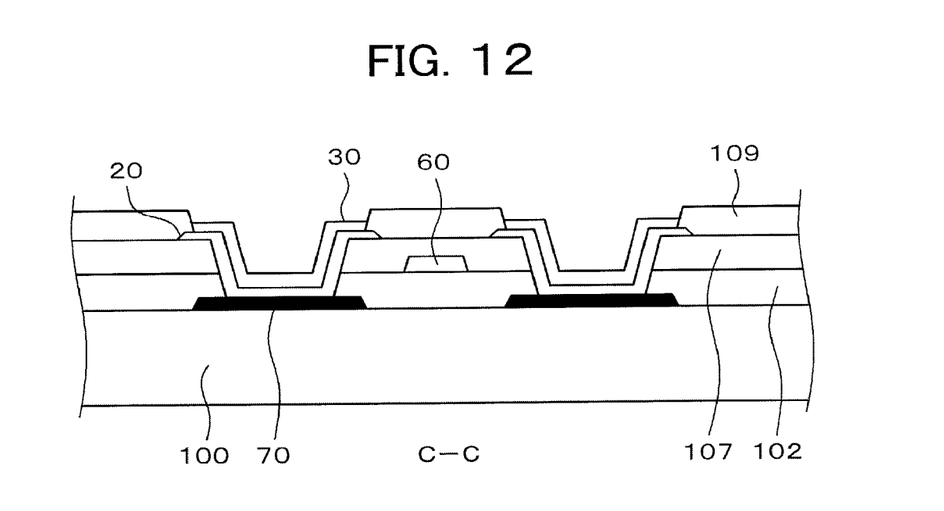
FIG. 12 is a sectional view taken along line C-C of FIG. 11.

FIG. 12 is a sectional view taken along line C-C of FIG. 11. In FIG. 12, a gate layer is used as terminal metal, and common ITO 20 makes contact with the gate layer terminal metal 70 through the through-hole formed in the gate insulation film 102 and the organic passivation film 107. The common ITO 20 is made polycrystalline at the time of formation of an inter-layer dielectric 109, with the result that pixel ITO 30 in contact with the common ITO 20 is made polycrystalline. When the pixel ITO 30 is subjected to etching conducted using oxalic acid, that portion of the pixel ITO 30 which is in contact with the common ITO 20, or that portion of the pixel ITO 30 which is located inside the through-hole 50 in the inter-layer dielectric 109, is only left unetched.

In the case where the gate electrode layer is thus used as the terminal metal, also, the distance between the pixel ITOs can be enlarged and the probability of short-circuiting between the terminals can be reduced, like in the first embodiment.

Fourth Embodiment

Figure 13:
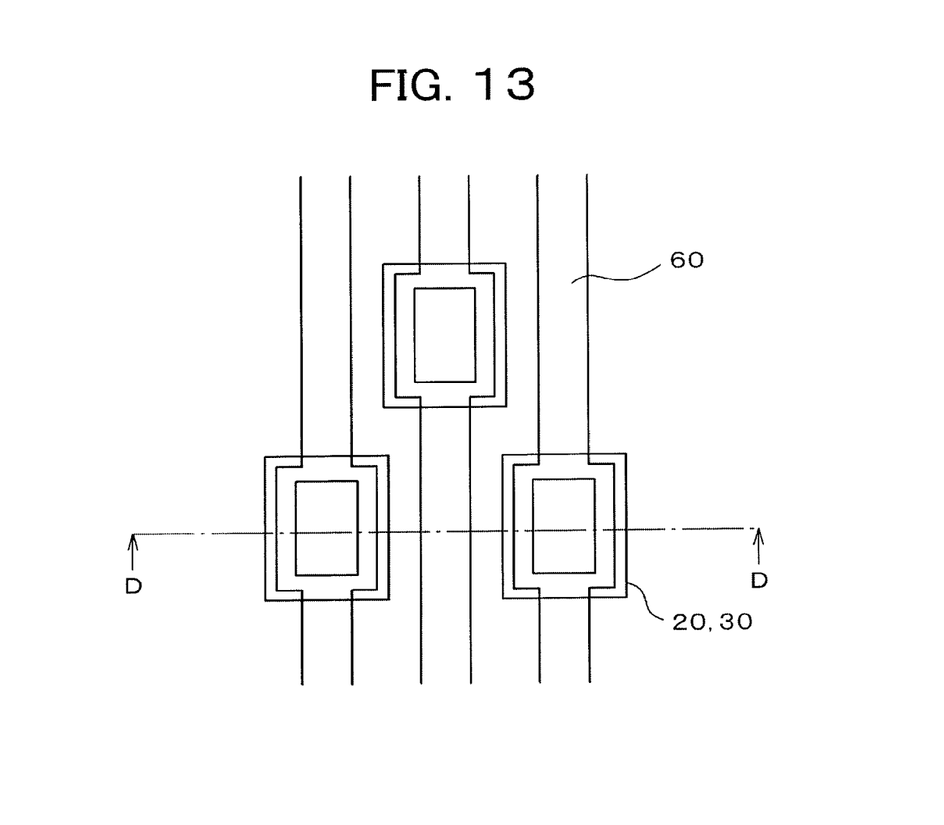
FIG. 13 is a plan view of terminals in a fourth embodiment.

FIG. 13 is a plan view showing a fourth embodiment of the present invention. In FIG. 13, a common ITO 20 in contact with a terminal metal 60 is the same in shape as a pixel ITO 30. This fourth embodiment shown in FIG. 13 differs largely from the first embodiment shown in FIG. 3 in that the inter-layer dielectric 109 is absent in FIG. 13.

Figure 14:
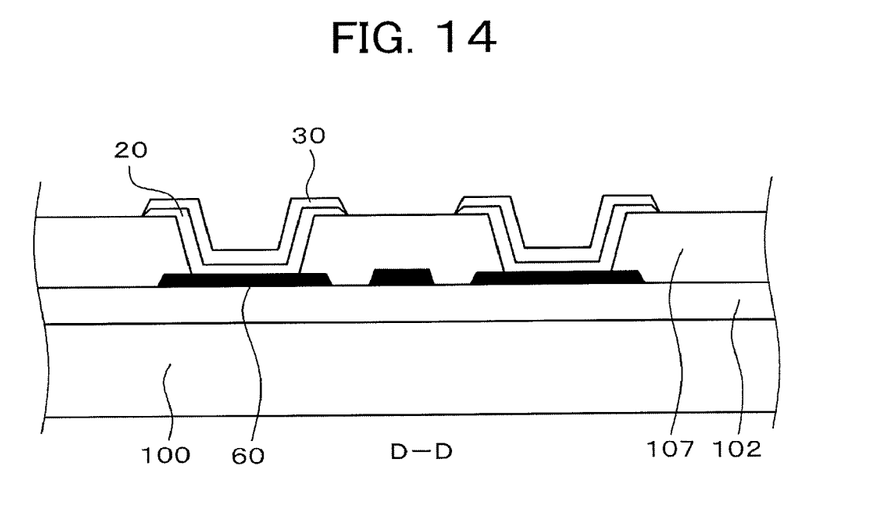
FIG. 14 is a sectional view taken along line D-D of FIG. 13.

FIG. 14 is a sectional view taken along line D-D of FIG. 13. In FIG. 14, in a through-hole 40 in an organic passivation film 107, the common ITO 20 is patterned so as to make contact with the terminal metal. In this fourth embodiment, the inter-layer dielectric 109 is completely removed at the terminal. Thereafter, the pixel ITO 30 is formed by sputtering, when only that portion of the pixel ITO 30 which is in contact with the common ITO 20 is made to be polycrystalline. This is because the common ITO 20 has been made polycrystalline by the temperature rise at the time of formation of the inter-layer dielectric 109, which is absent at the terminal in this fourth embodiment. Under this condition, the pixel ITO 30 is subjected to etching conducted using oxalic acid, when only the pixel ITO 30 being in contact with the common ITO 20 is left unetched.

According to the present invention, the pixel ITO 30 is not getting onto the inter-layer dielectric 109, so that the terminal width can be reduced accordingly and, hence, the distance between the terminals can be enlarged accordingly, as compared with the related art. In other words, the inter-layer dielectric 109 is absent in the terminal areas, and the width of the through-hole can be reduced accordingly.

Fifth Embodiment

Figure 15:
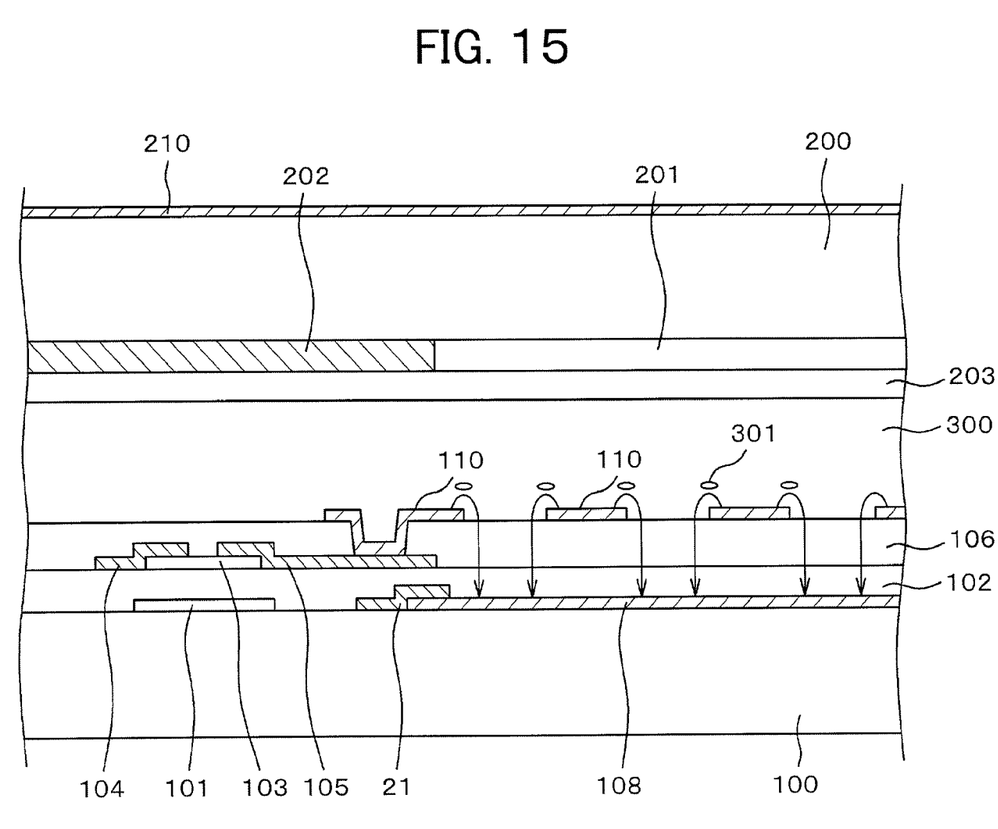
FIG. 15 is a sectional view of a pixel region of another IPS liquid crystal display device.

A fifth embodiment is an example wherein the present invention is applied to another IPS structure. FIG. 15 shows a sectional structure of a pixel part in IPS of a type different from that shown in FIG. 2. In FIG. 15, a gate electrode 101 is formed on a TFT substrate 100 formed of a glass, a gate insulation film 102 is formed thereon, and a semiconductor layer 103, a drain electrode 104, a source electrode 105, etc. are formed on the upper side of the gate electrode 101 to constitute a TFT, in the same manner as in the configuration described above referring to FIG. 2.

The configuration shown in FIG. 15 is characterized in that a common electrode 108 composed of ITO is formed on the TFT substrate 100, which is a glass substrate. The common electrode 108 is supplied with a common voltage by way of a common wiring 21. An inorganic passivation film 106 is formed so as to cover the TFT and the gate insulation film 102, and a pixel electrode 110 having slits is formed on the inorganic passivation film 106. A pixel electrode 110 is supplied with an image signal by way of a through-hole formed in the inorganic passivation film 106. The configuration of a counter substrate 200 is the same as in FIG. 2, and, therefore, description thereof is omitted here. In FIG. 15, an alignment film is omitted.

Figure 16:
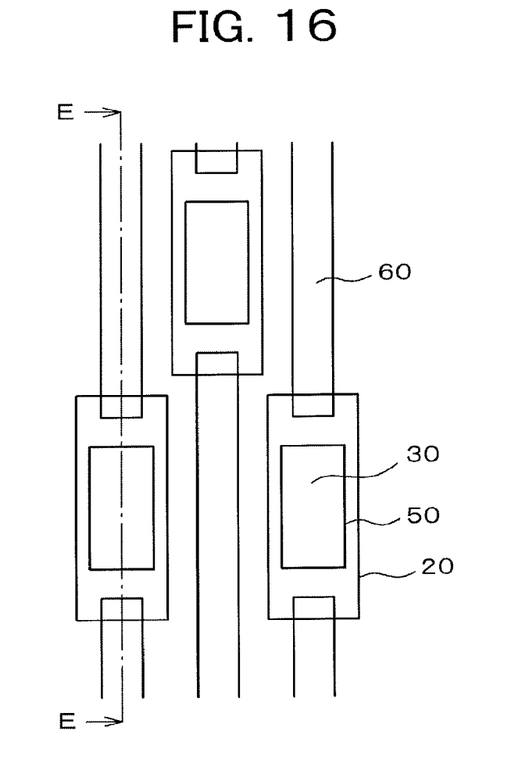
FIG. 16 is a plan view of terminals in a fifth embodiment.
Figure 17:
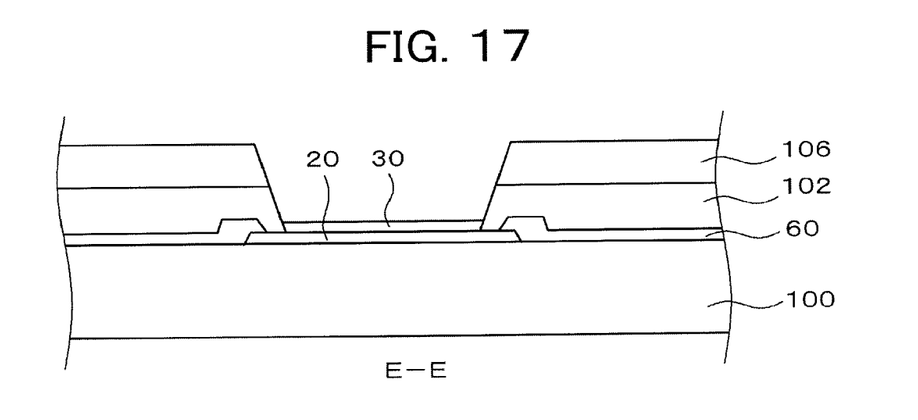
FIG. 17 is a sectional view taken along line E-E of FIG. 16.

The structure shown in FIG. 15 is not restrictive. In a liquid crystal display device with a pixel configuration as shown in FIG. 15, specifically, with a structure wherein the metal and the ITO are set in contact with each other without being intermediated by a through-hole, like the common wiring 21 and the common electrode 108, a terminal structure as shown in FIGS. 16 and 17 may be formed. FIG. 16 is a plan-view structure of terminals in this fifth embodiment. The structure shown in FIG. 16 is characterized that the terminal metal is absent in the through-hole at the terminal. Therefore, there is no problem of corrosion of terminal metal in the through-hole at the terminal.

In FIG. 16, a drain layer terminal metal 60 and the common ITO 20 are interconnected an area other than the through-hole 50 formed in the gate insulation film 102 and the inorganic passivation film 106. In addition, a pixel ITO 30 is formed inside the through-hole 50.

FIG. 17 is a sectional view taken along line E-E of FIG. 16. In FIG. 17, the common ITO 20 connected to the drain layer terminal metal 60 is formed on the TFT substrate 100, and the through-hole in the gate insulation film 102 and the inorganic passivation film 106 is formed in this area of the common ITO 20. The common ITO 20 has been made polycrystalline during the process of forming the gate insulation film 102 and the inorganic passivation film 106.

Under this condition, a pixel ITO 30 is formed by sputtering, when only the pixel ITO 30 in contact with the common ITO 20 in the through-hole is made to be polycrystalline. When the pixel ITO 30 is subjected to etching conducted using oxalic acid under this condition, only the pixel ITO 30 inside the through-hole is left unetched, whereby the terminal in this fifth embodiment is formed.

In this embodiment, also, the pixel ITO 30 is formed only inside the through-hole formed in the inorganic passivation film 106 and the gate insulation film 102. Therefore, the distance between the pixel ITOs 30 can be enlarged, and the danger of short-circuiting between the terminals can be avoided.

While the liquid crystal display device has been described in the foregoing, the present invention is applicable generally to display devices having terminals for connection with external equipment, such as organic EL display devices in which self-light-emitting organic EL display elements are used.

What is claimed is:

1. A display device comprising:
    a first substrate having a terminal region; and
    an IC driver mounted in the terminal region; wherein:
    the terminal region has a plurality of terminals;
    each of the terminals includes
    a terminal metal,
    a first insulation film formed on the terminal metal,
    a first through-hole formed in the first insulation film,
    a first conductive layer formed in the first through-hole and being in contact with the terminal metal,
    a second insulation film formed on the first conductive layer, and
    a second through-hole formed in the second insulation film,
    wherein an end of the first conductive layer is covered by the second insulating film,
    wherein the second insulating film is formed between each of the terminals,
    wherein a second conductive layer formed in the second through-hole and being in contact with the first conductive layer, and
    wherein the second conductive layer is not formed outside the second through-hole.

2. The display device according to claim 1, wherein a width of the second conductive layer is narrower than a width of the first conductive layer.

3. The display device according to claim 1, wherein: the width of the second conductive layer is smaller than a width of the terminal metal.

4. The display device according to claim 1, wherein an end of the second conductive layer is not covered by the second insulating film.

5. The display device according to claim 1, wherein: the second conductive layer, which is in contact with the first conductive layer, is polycrystalline.

6. A display device comprising:
    a first substrate having a terminal region; and
    an IC driver mounted in the terminal region; wherein:
    the terminal region has a plurality of terminals;
    each of the terminals includes
    a terminal metal,
    an insulation film formed on the terminal metal,
    a through-hole formed in the insulation film,
    a first conductive layer formed at a bottom of the through-hole and in contacted with the terminal metal,
    a second conductive layer formed in the through-hole,
    wherein the second conductive layer is formed within an area where the second conductive layer is in contact with the first conductive layer but is not formed outside the through-hole,
    wherein the plurality of terminals are arranged in a staggered pattern, and
    wherein an end of the first conductive layer is covered by the terminal metal.

7. The display device according to claim 6, wherein a width of the second conductive layer is narrower than a width of the first conductive layer.

8. The display device according to claim 7, wherein the width of the second conductive layer is equal to the width of the through-hole.

9. The display device according to claim 6, wherein the second conductive layer that contacts with the first conductive layer is polycrystalline.

10. The display device according to claim 6, wherein the first conductive layer is in contact with the terminal metal outside the through-hole.

11. The display device according to claim 6, wherein the terminal metal is not formed in the through-hole.

* * * * *